(12) United States Patent
Yang et al.

(10) Patent No.: US 11,747,580 B2
(45) Date of Patent: Sep. 5, 2023

(54) OPTICAL PORT SHIELDING AND FASTENING APPARATUS, OPTICAL MODULE, AND COMMUNICATIONS DEVICE

(71) Applicant: HUAWEI TECHNOLOGIES CO., LTD., Shenzhen (CN)

(72) Inventors: Song Yang, Wuhan (CN); Sufei Miao, Shenzhen (CN); Zhigang Wang, Wuhan (CN); Liang Xu, Shenzhen (CN); Yu Huang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/851,705

(22) Filed: Jun. 28, 2022

(65) Prior Publication Data
US 2022/0326459 A1  Oct. 13, 2022

Related U.S. Application Data

(63) Continuation of application No. PCT/CN2019/130774, filed on Dec. 31, 2019.

(51) Int. Cl.
*H04B 10/00* (2013.01)
*G02B 6/42* (2006.01)
*H05K 9/00* (2006.01)

(52) U.S. Cl.
CPC ........... *G02B 6/4277* (2013.01); *G02B 6/426* (2013.01); *H05K 9/0058* (2013.01); *G02B 6/428* (2013.01)

(58) Field of Classification Search
CPC combination set(s) only.
See application file for complete search history.

(56) References Cited

U.S. PATENT DOCUMENTS

| 6,878,872 B2 * | 4/2005 | Lloyd | H01R 13/6594 361/818 |
| 7,928,324 B2 * | 4/2011 | Moore | H05K 9/0058 174/382 |

(Continued)

FOREIGN PATENT DOCUMENTS

| CN | 204669368 U | 9/2015 |
| CN | 106772832 A | 5/2017 |

(Continued)

OTHER PUBLICATIONS

Extended European Search Report issued in corresponding European Application No. 19958429.3, dated Nov. 24, 2022, pp. 1-8.

(Continued)

*Primary Examiner* — Agustin Bello
(74) *Attorney, Agent, or Firm* — HAUPTMAN HAM, LLP

(57) ABSTRACT

An optical port shielding and fastening apparatus is configured to be installed in the optical module. The optical module includes a housing assembly and an optical component located in the housing assembly. The optical port shielding and fastening apparatus includes a fastener and an electromagnetic wave absorbing piece. The fastener is fastened in the housing assembly. The electromagnetic wave absorbing piece is fastened on a side that is of the fastener and that faces an outside of the housing assembly. A first mounting hole and a second mounting hole are correspondingly provided on the fastener and the electromagnetic wave absorbing piece. The optical component passes through the first mounting hole and the second mounting hole in sequence. This application provides an optical port shielding and fastening apparatus, an optical module, and a communications device, to resolve poor optical port shielding performance of an optical module in the related technology.

20 Claims, 6 Drawing Sheets

(56) References Cited

U.S. PATENT DOCUMENTS

| | | | | |
|---|---|---|---|---|
| 8,622,770 | B2* | 1/2014 | Teo | G02B 6/4277 |
| | | | | 439/607.2 |
| 8,967,884 | B2* | 3/2015 | Kondou | G02B 6/4246 |
| | | | | 385/92 |
| 11,064,636 | B2* | 7/2021 | He | H05K 9/0058 |
| 11,378,764 | B2* | 7/2022 | Zhou | G02B 6/4256 |
| 2002/0085254 | A1* | 7/2002 | Kurata | G02B 6/4246 |
| | | | | 398/164 |
| 2002/0110336 | A1* | 8/2002 | Dair | G02B 6/4246 |
| | | | | 385/92 |
| 2003/0103736 | A1* | 6/2003 | Brezina | G02B 6/4246 |
| | | | | 385/88 |
| 2003/0161108 | A1* | 8/2003 | Bright | H05K 9/0058 |
| | | | | 361/707 |
| 2005/0018979 | A1* | 1/2005 | Mizue | G02B 6/4277 |
| | | | | 385/92 |
| 2005/0135769 | A1* | 6/2005 | Makooi | G02B 6/4277 |
| | | | | 385/135 |
| 2006/0068639 | A1* | 3/2006 | Barringer | H05K 9/0058 |
| | | | | 439/607.01 |
| 2007/0128936 | A1* | 6/2007 | Long | H01R 13/6584 |
| | | | | 439/607.28 |
| 2008/0145004 | A1* | 6/2008 | Ice | G02B 6/4255 |
| | | | | 385/92 |
| 2008/0145006 | A1 | 6/2008 | Ice | |
| 2008/0315528 | A1* | 12/2008 | Moore | H05K 9/0058 |
| | | | | 277/653 |
| 2009/0067149 | A1* | 3/2009 | Bogursky | H01L 23/552 |
| | | | | 205/118 |
| 2010/0296817 | A1* | 11/2010 | Togami | G02B 6/43 |
| | | | | 398/139 |
| 2012/0269486 | A1* | 10/2012 | Ishii | G02B 6/4246 |
| | | | | 385/92 |
| 2013/0142490 | A1* | 6/2013 | Teo | G02B 6/4261 |
| | | | | 361/752 |
| 2015/0370020 | A1* | 12/2015 | Engel | G02B 6/4214 |
| | | | | 385/33 |
| 2017/0059798 | A1* | 3/2017 | Ritter | G02B 6/4277 |
| 2017/0097484 | A1* | 4/2017 | Teo | H05K 1/0274 |
| 2017/0160500 | A1* | 6/2017 | Zhao | G02B 6/4292 |
| 2017/0160502 | A1* | 6/2017 | Zhao | G02B 6/4277 |
| 2017/0254973 | A1* | 9/2017 | Yu | H01R 13/6581 |
| 2017/0315315 | A1* | 11/2017 | Zhou | G02B 6/4277 |
| 2018/0177082 | A1* | 6/2018 | Wei | H04N 23/54 |
| 2019/0098804 | A1* | 3/2019 | Wang | H04B 10/40 |
| 2020/0341219 | A1* | 10/2020 | Zhou | G02B 6/4292 |
| 2021/0100140 | A1* | 4/2021 | He | H05K 9/0088 |
| 2022/0283629 | A1* | 9/2022 | Bright | G06F 3/011 |
| 2022/0326459 | A1* | 10/2022 | Yang | G02B 6/4279 |

FOREIGN PATENT DOCUMENTS

| | | |
|---|---|---|
| CN | 107329217 A | 11/2017 |
| CN | 108235671 A | 6/2018 |
| CN | 109324377 A | 2/2019 |
| CN | 209281013 U | 8/2019 |
| CN | 110275256 A | 9/2019 |
| CN | 209821445 U | 12/2019 |
| EP | 3514973 A1 | 7/2019 |

OTHER PUBLICATIONS

International Search Report issued in corresponding International Application No. PCT/CN2019/130774, dated Sep. 2, 2020, pp. 1-9.

* cited by examiner

OPTICAL PORT SHIELDING AND FASTENING APPARATUS, OPTICAL MODULE, AND COMMUNICATIONS DEVICE

CROSS-REFERENCE TO RELATED DISCLOSURES

This application is a continuation of International Application No. PCT/CN2019/130774, filed on Dec. 31, 2019, the disclosure of which is hereby incorporated by reference in its entirety.

TECHNICAL FIELD

This application relates to the field of electronic device technologies, and in particular, to an optical port shielding and fastening apparatus, an optical module, and a communications device.

BACKGROUND

An optical module is an important communications interface component in an optical communications technology, and is widely applied to devices such as a switch, a router, and a data center device. Specifically, the optical module is used for optical-to-electrical conversion. A transmit end of the optical module converts an electrical signal into an optical signal and transmits the optical signal through an optical fiber. A receive end of the optical module converts a received optical signal into an electrical signal. With development of the optical communications industry, it is always accompanied by the discussion and evolution of issues such as optoelectronic performance indicator, reliability, electromagnetic radiation compatibility, and electrostatic protection. In addition to bringing convenience to people, an optical communications device also brings negative impact. For example, if electromagnetic radiation exceeds a threshold, it may cause discomfort to a human body in a short term, and may cause aging and deterioration of human cells in a long term, which significantly affects a lifespan of the human body. Therefore, during research and development of the optical module, the negative impact of the electromagnetic radiation needs to be reduced.

The optical module generally includes a housing and a circuit board placed inside the housing. An optical emitting component and an optical receiving component are connected to the circuit board. An electronic component configured to perform various functions of the optical module is disposed on the circuit board. The optical emitting component and the optical receiving component pass through the housing and are connected to an optical fiber. In a working process of the optical module, the electronic component in the optical module generates an electromagnetic wave. For example, a high-frequency chip laser driver, an amplitude-limiting amplifier, or a trans-impedance amplifier generates a high-frequency electromagnetic wave, and electromagnetic interference is generated when the electromagnetic wave radiates out of the optical module. In a related technology, a metal piece is disposed at an optical port of an optical module, and the metal piece has a shielding function. In addition, the metal piece and an inner wall of a housing are lap joined through a spring plate, to fasten the optical module.

However, when the metal piece and the inner wall of the housing are lap joined, some spring plates are not properly attached. Consequently, electromagnetic shielding performance is affected.

SUMMARY

This application provides an optical port shielding and fastening apparatus, an optical module, and a communications device, to resolve poor optical port shielding performance of an optical module in the related technology.

An aspect of this application provides an optical port shielding and fastening apparatus, configured to be installed in an optical module. The optical module includes a housing assembly and an optical component located in the housing assembly. The optical port shielding and fastening apparatus includes a fastener and an electromagnetic wave absorbing piece. The fastener is fastened in the housing assembly. The electromagnetic wave absorbing piece is fastened on a side that is of the fastener and that faces an outside of the housing assembly. A first mounting hole and a second mounting hole are correspondingly provided on the fastener and the electromagnetic wave absorbing piece. The optical component passes through the first mounting hole and the second mounting hole in sequence.

The fastener is configured to be sleeved on the optical component, and has both shielding and fastening functions. The electromagnetic wave absorbing piece is fastened to the fastener, and mainly has a function of absorbing electromagnetic waves. The first mounting hole is disposed on the fastener, and a spring plate is disposed in the first mounting hole, so that the optical component can be connected and a connection tolerance can be absorbed. A size of the second mounting hole may be slightly less than an outer diameter of an end part of the optical component, so that the optical component is connected to the electromagnetic wave absorbing piece through interference fit at the second mounting hole. In this way, at the second mounting hole, sealing performance is high, and radiation is further prevented from leaking from a position of the second mounting hole.

The optical port shielding and fastening apparatus provided in at least one embodiment of this application has the fastener and the electromagnetic wave absorbing piece. The fastener and the electromagnetic wave absorbing piece separately shield and absorb electromagnetic radiation, so that electromagnetic radiation energy at an optical port can be effectively reduced, and electromagnetic energy radiated from inside the optical module and electromagnetic energy radiated from external electromagnetic energy to inside the optical module can be reduced. In this way, an EMC feature of the optical module is optimized and electromagnetic interference is reduced. In addition, the optical port shielding and fastening apparatus can meet both positioning and vibration reduction requirements. This effectively simplifies module parts and improves module assembly efficiency.

In a possible implementation, a plurality of spring plates are disposed on a periphery of an inner wall of the first mounting hole, and the spring plate is configured to press against the optical component.

Because the plurality of spring plates are densely arranged on an inner ring of the first mounting hole, and the spring plate has specific elasticity, the optical component and the fastener can still be well lap joined when a small amount of displacement occurs. Therefore, shielding effectiveness of the fastener is improved. In a possible implementation, the fastener further includes a plate-shaped body and a shielding finger. The shielding finger is connected to a bottom edge and two side edges of the plate-shaped body and is disposed bent toward a side away from the electromagnetic wave absorbing piece. The shielding finger is configured to press against the housing assembly.

In at least one embodiment, the plate-shaped body may be disposed as a rectangular plate-shaped structure, and two first mounting holes are provided on the plate-shaped body in a length direction, to separately install two optical components. Shielding fingers are separately disposed on a left side, a right side, and a bottom surface of the plate-shaped body. The shielding fingers have specific elasticity, and elastic deformation occurs after the shielding fingers are extruded. The shielding fingers are separately configured to press against the housing assembly, to ensure reliable fastening of the fastener.

In a possible implementation, the fastener further includes a protective plate. The protective plate is connected to a top edge of the plate-shaped body and is disposed bent toward a side close to the electromagnetic wave absorbing piece.

A width of the protective plate is less than a width of the shielding finger, and has high strength. The protective plate is mainly disposed to separate the electromagnetic wave absorbing piece from an optical port cover, to prevent the optical port cover from damaging the electromagnetic wave absorbing piece.

In a possible implementation, the electromagnetic wave absorbing piece is attached to the fastener by using adhesive.

A connection manner of the electromagnetic wave absorbing piece and the fastener is not specifically limited. The electromagnetic wave absorbing piece may be attached to the fastener by using the adhesive. In this case, the connection between the electromagnetic wave absorbing piece and the fastener is reliable, and an overall structure of the optical port shielding and fastening apparatus is simple and easy to implement.

In a possible implementation, the electromagnetic wave absorbing piece is a conductive foam.

A working principle of the electromagnetic wave absorbing piece is that, through absorption means, a wave-absorbing material such as the conductive foam is used, and the wave-absorbing material converts an electromagnetic wave into heat energy to consume an electromagnetic wave that affects a system. The conductive foam not only has better electromagnetic shielding performance, but also has a function of buffering and damping. After being installed in the optical module, the conductive foam presses against a stopper cavity on a bottom housing, and can achieve a good electromagnetic shielding effect without occupying a large space.

In a possible implementation, the fastener is an integrally formed sheet metal component.

Integrated molding is not only convenient for processing and manufacturing, but also facilitates convenient and fast installation.

Another aspect of this application provides an optical module, including a housing assembly, an optical component located inside the housing assembly, and the foregoing optical port shielding and fastening apparatus.

According to the optical module provided in at least one embodiment of this application, the optical port shielding and fastening apparatus having a fastener and an electromagnetic wave absorbing piece is additionally disposed. The fastener and the electromagnetic wave absorbing piece shield and absorb electromagnetic radiation, so that electromagnetic radiation energy at an optical port can be effectively reduced.

The housing assembly includes a bottom housing and an optical port cover. A stopper cavity is disposed on the bottom housing, the optical port shielding and fastening apparatus is disposed in the stopper cavity, and the electromagnetic wave absorbing piece is in interference fit with a wall surface of the stopper cavity. The optical port cover is disposed above the optical port shielding and fastening apparatus and fits the bottom housing.

The housing assembly further includes an upper cover. The upper cover is disposed on the bottom housing, to form a closed accommodation space. An electrical appliance and an electronic device in the optical module are assembled in the accommodation space.

The upper cover and the bottom housing each may be disposed as a metal piece. A material of the metal piece may be zinc alloy, and a surface of the metal piece is plated with nickel. The upper cover and the bottom housing are fastened and connected through a threaded fastener, which ensures reliable assembly and facilitates assembly and disassembly.

An unlocking assembly is disposed at a front end of the housing assembly. The unlocking assembly fits the bottom housing. Specifically, the unlocking assembly may be of a pluggable cage structure, and is configured to implement self-locking and unlocking functions of the optical module.

A circuit board is disposed inside the optical module. A front end position that is of the circuit board and that is close to the unlocking assembly is used for connecting the optical component. An optical port cover is disposed above the front end position. The optical port cover is disposed above the optical component, to limit a position of the optical component. The optical component forms an optical port. A back end of the circuit board is disposed with an edge connector. The edge connector forms an electrical port of the optical module. The optical component is connected to the circuit board through a flexible plate. The optical component may include a transmitter optical subassembly (TOSA) and a receiver optical subassembly (ROSA). The optical component is encapsulated in a protuberantly disposed near-cylindrical metal piece.

An assembly procedure of the optical module provided in at least one embodiment of this application is as follows: First, the unlocking assembly is assembled on the bottom housing, the optical component and another auxiliary material are assembled at a corresponding position on the circuit board, and then the optical port shielding and fastening apparatus is connected to a front end of the optical component. Then, the circuit board connected to the optical component, the optical port shielding and fastening apparatus, and the like is integrally fastened on the bottom housing, the optical port cover is installed above the optical port, and finally the upper cover is disposed above the bottom housing, and the threaded fastener is tightened.

According to the optical module provided in at least one embodiment of this application, the optical port shielding and fastening apparatus having the fastener and the electromagnetic wave absorbing piece is additionally disposed. The fastener and the electromagnetic wave absorbing piece separately shield and absorb electromagnetic radiation, so that electromagnetic radiation energy at the optical port can be effectively reduced, and electromagnetic energy radiated from inside the optical module and electromagnetic energy radiated from external electromagnetic energy to inside the optical module can be reduced. In this way, an EMC feature of the optical module is optimized and electromagnetic interference is reduced. In addition, the optical port shielding and fastening apparatus can meet both positioning and vibration reduction requirements. This effectively simplifies module parts and improves module assembly efficiency.

Still another aspect of this application provides a communications device, including the foregoing optical module.

The communications device includes a switch, a router, a data center device, and the like. The optical module converts information (such as voice) to be transmitted into an electrical signal, and then modulates the electrical signal to a laser beam emitted by a laser of the optical module. In this way, intensity of light varies with a change of an amplitude or a frequency of the electrical signal, and an optical signal is transmitted through an optical fiber. When the optical module receives the optical signal, a photodiode in the optical module converts the optical signal into an electrical signal, and demodulates the electrical signal to restore original information.

The communications device provided in at least one embodiment of this application has the optical module. An optical port shielding and fastening apparatus having a fastener and an electromagnetic wave absorbing piece is disposed in the optical module. The fastener and the electromagnetic wave absorbing piece separately shield and absorb electromagnetic radiation, so that electromagnetic radiation energy at an optical port can be effectively reduced, and electromagnetic energy radiated from inside the optical module and electromagnetic energy radiated from external electromagnetic energy to inside the optical module can be reduced. In this way, an EMC feature of the optical module is optimized and overall electromagnetic interference of the communications device is reduced. In addition, the optical port shielding and fastening apparatus can meet both positioning and vibration reduction requirements. This effectively simplifies module parts and improves optical module assembly efficiency, and further reduce costs of the entire communications device.

DESCRIPTION OF EMBODIMENTS

Figure 1:
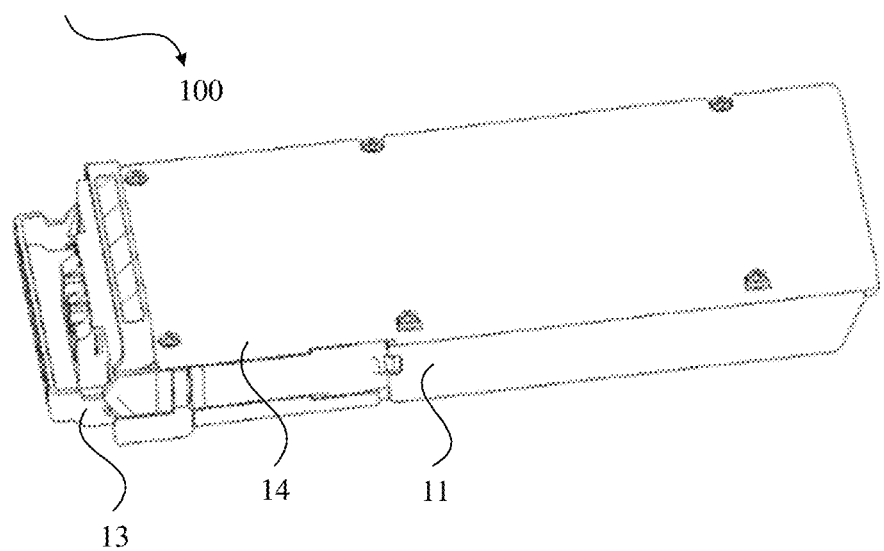
FIG. 1 is a schematic diagram of an overall structure of an optical module according to at least one embodiment of this application.

An optical module is an important communications interface component in an optical communications technology, and is widely applied to devices such as a switch, a router, and a data center device. Specifically, the optical module is used for optical-to-electrical conversion. A transmit end of the optical module converts an electrical signal into an optical signal and transmits the optical signal through an optical fiber. A receive end of the optical module converts a received optical signal into an electrical signal.

In the field of optical communications technologies, electromagnetic compatibility (EMC) refers to performance that a device can work normally in its own environment without causing strong electromagnetic interference to any other device in this environment. With density of optical modules on boards and distribution of operators increase, a requirement for EMC of the optical modules is increasingly high.

An electrical appliance and an electronic device in the optical module have intermittent or continuous voltage and current changes when working. Sometimes, a change rate is quite fast. As a result, electromagnetic energy is generated within different frequencies or between a frequency band. A corresponding circuit emits the energy to a surrounding environment. One is signal radiation. The electromagnetic energy is leaked out through a slit, a slot, an opening, or another gap of a housing. The other one is signal conduction. The electromagnetic energy leaves the housing by coupling to power, a signal, and a control line, and radiates freely in an open space, resulting in interference and an EMC problem.

The optical module generally includes a housing and a circuit board placed inside the housing. An optical emitting component and an optical receiving component are connected to the circuit board. An electronic component configured to perform various functions of the optical module is disposed on the circuit board. The optical emitting component and the optical receiving component pass through the housing and are connected to an optical fiber. In a working process of the optical module, the electronic component in the optical module generates an electromagnetic wave. For example, a high-frequency chip laser driver, an amplitude-limiting amplifier, or a trans-impedance amplifier generates a high-frequency electromagnetic wave, and electromagnetic interference is generated when the electromagnetic wave radiates out of the optical module.

In a related technology, a metal piece is disposed at an optical port of an optical module, and the metal piece has a shielding function. In addition, the metal piece and an inner wall of a housing are lap joined through a spring plate, to fasten the optical module. However, when the metal piece and the inner wall of the housing are lap joined, some spring plates are not properly attached. Consequently, electromagnetic shielding performance is affected.

To resolve the foregoing problem, at least one embodiment of this application provides an optical port shielding and fastening apparatus. A fastener and an electromagnetic wave absorbing piece are combined to enhance electromagnetic shielding performance. In addition, the optical port shielding and fastening apparatus can simplify module parts and improve optical module assembly efficiency.

With reference to the accompanying drawings and specific embodiments, the following describes in detail an optical port shielding and fastening apparatus, an optical module, and a communications apparatus that are provided in this application.

FIG. 1 is a schematic diagram of an overall structure of an optical module according to at least one embodiment of this application. As shown in FIG. 1, the optical module includes a housing assembly 100. The housing assembly 100 includes an upper cover 14 and a bottom housing 11. The upper cover 14 is disposed on the bottom housing 11, to form a closed accommodation space. An electrical appliance and an electronic device in the optical module are assembled in the accommodation space.

The upper cover 14 and the bottom housing 11 each may be disposed as a metal piece. A material of the metal piece may be zinc alloy, and a surface of the metal piece is plated with nickel. The upper cover 14 and the bottom housing 11 are fastened through a threaded fastener, which ensures reliable assembly and facilitates assembly and disassembly. An unlocking assembly 13 is disposed at a front end of the housing assembly 100. The unlocking assembly 13 fits the bottom housing 11. Specifically, the unlocking assembly 13 may be of a pluggable cage structure, and is configured to implement self-locking and unlocking functions of the optical module.

Figure 2:
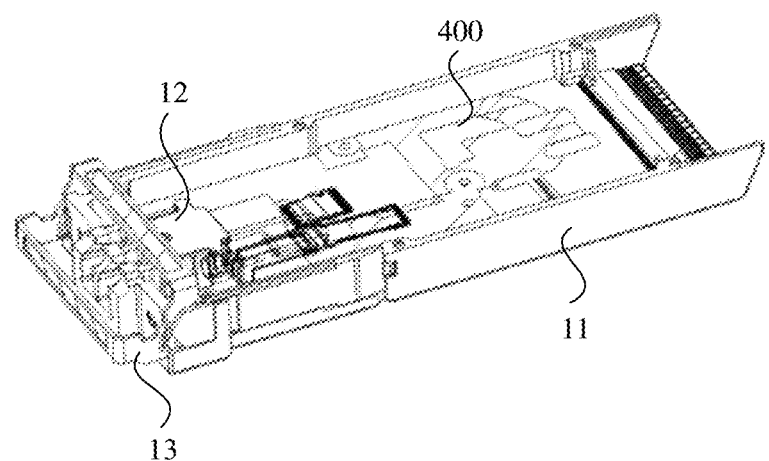
FIG. 2 is a schematic diagram of a structure of an optical module after an upper cover is removed according to at least one embodiment of this application.

FIG. 2 is a schematic diagram of a structure of an optical module after an upper cover is removed according to at least one embodiment of this application. As shown in FIG. 2, after the upper cover 14 of the optical module is removed, a schematic diagram of an internal structure of the optical module may be obtained. A circuit board 400 is disposed inside the optical module. A front end position that is of the circuit board 400 and that is close to the unlocking assembly 13 is used for connecting an optical component. An optical port cover 12 is disposed above the front end position. The optical port cover 12 is disposed above the optical component, to limit a position of the optical component.

Figure 3:
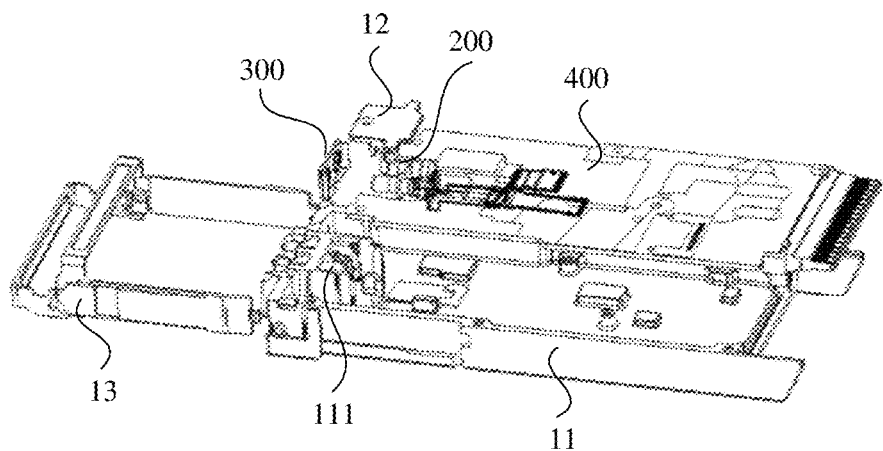
FIG. 3 is a schematic diagram of a disassembly structure of an optical module after an upper cover is removed according to at least one embodiment of this application.

FIG. 3 is a schematic diagram of a disassembly structure of an optical module after an upper cover is removed according to at least one embodiment of this application. As shown in FIG. 3, an optical component 200 is connected to a front end of the circuit board 400, and the optical component 200 forms an optical port. To shield and fasten the optical port, in at least one embodiment, an optical port shielding and fastening apparatus 300 is disposed at a front end of the optical component 200.

Specifically, the optical component 200 is connected to the circuit board 400 through a flexible plate. The optical component 200 may include a transmitter optical subassembly (TOSA) and a receiver optical subassembly (ROSA). The transmitter optical subassembly is a component that converts an electrical signal into an optical signal by using a laser and transmits the optical signal. The receiver optical subassembly is a component that converts a received optical signal into an electrical signal by using a photodiode. The optical component 200 is encapsulated in a protuberantly disposed near-cylindrical metal piece. The metal is mostly made of a stainless steel material and is a good conductor. The optical component 200 is connected to the circuit board 400 through the flexible plate. When the optical module works, both the flexible plate and the circuit board 400 emit electromagnetic waves.

The optical port shielding and fastening apparatus 300 is connected to an end part of the optical component 200, to shield inside the optical module. A stopper cavity 111 is disposed on the bottom housing 11, the optical port shielding and fastening apparatus 300 is disposed in the stopper cavity 111, and the optical port cover 12 is disposed above the optical port shielding and fastening apparatus 300 and can fit the stopper cavity 111 on the bottom housing 11. That is, the optical port cover 12 and the stopper cavity 111 on the bottom housing 11 are jointly used for fastening the optical port shielding and fastening apparatus 300. In addition, the optical port shielding and fastening apparatus 300, the bottom housing 11, and the optical port cover 12 jointly fasten the optical component 200.

Figure 4:
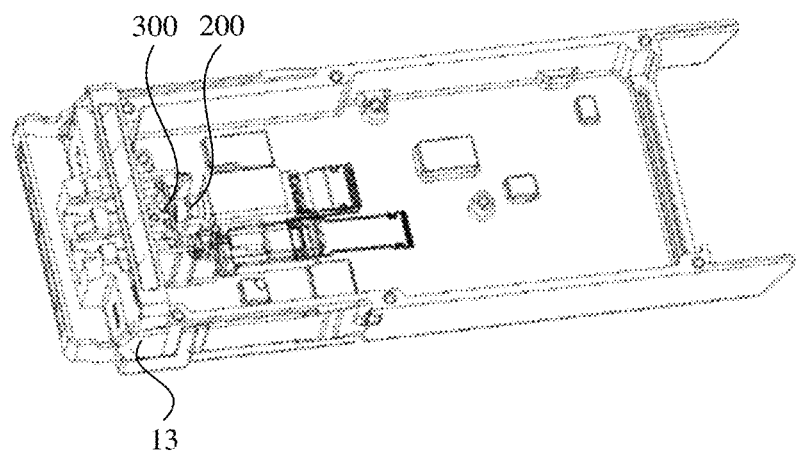
FIG. 4 is a schematic diagram of a structure of an optical module after an upper cover, an optical port cover, and a circuit board are removed according to at least one embodiment of this application.

FIG. 4 is a schematic diagram of a structure of an optical module after an upper cover, an optical port cover, and a circuit board are removed according to at least one embodiment of this application. As shown in FIG. 4, the optical port shielding and fastening apparatus 300 is sleeved at the end part of the optical component 200, to shield inside the optical module and fasten the optical component 200.

Figure 5:
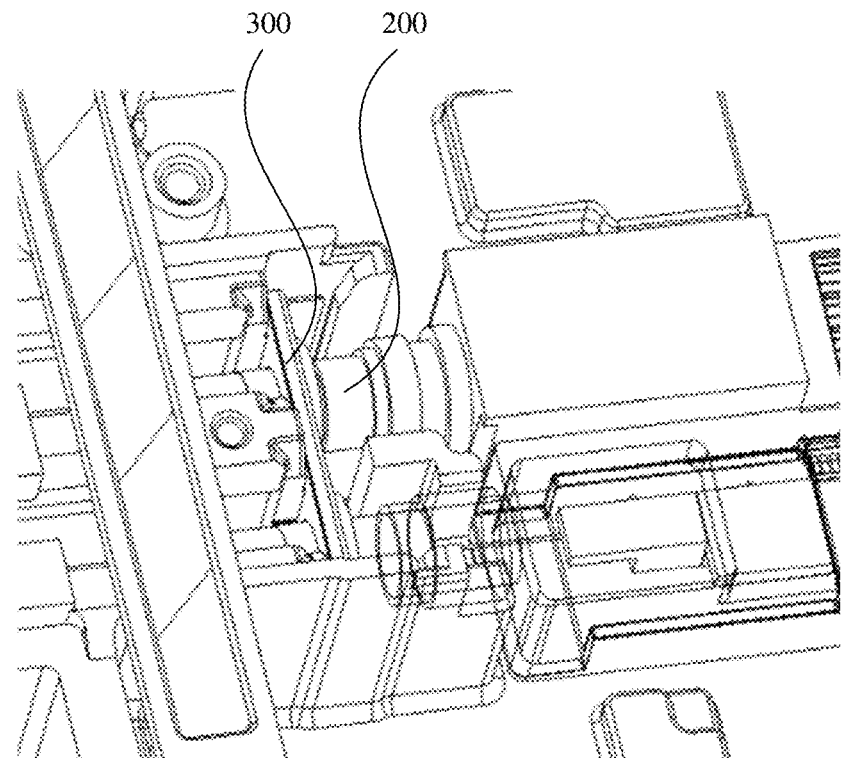
FIG. 5 is a schematic diagram of a partially enlarged structure of FIG. 4.

FIG. 5 is a schematic diagram of a partially enlarged structure of FIG. 4. As shown in FIG. 5, two optical components 200, namely, the transmitter optical subassembly (TOSA) and the receiver optical subassembly (ROSA), are separated by a mechanical part protuberantly disposed above the bottom housing 11, to prevent interference between the two components. One side of the optical port shielding and fastening apparatus 300 is disposed facing the optical component 200, and the other side presses against and protuberantly disposed on a stopper above the bottom housing 11, to implement reliable fastening.

Figure 6:
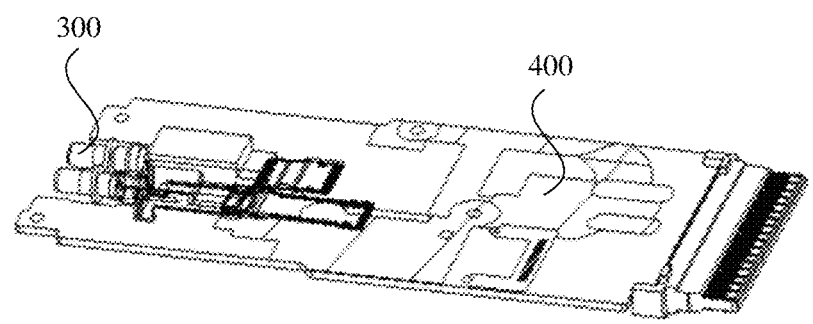
FIG. 6 is a schematic diagram of a structure of a circuit board and an optical component according to at least one embodiment of this application.

FIG. 6 is a schematic diagram of a structure of a circuit board and an optical component according to at least one embodiment of this application. As shown in FIG. 6, a plurality of mounting holes are provided on the circuit board 400, to be fastened on the bottom housing 11. The circuit board 400 is coupled to the optical component 200, to implement an optical-to-electrical conversion function. The optical component 200 is connected to the front end of the circuit board 400. A back end of the circuit board 400 is disposed with an edge connector. The edge connector forms an electrical port of the optical module.

Figure 7:
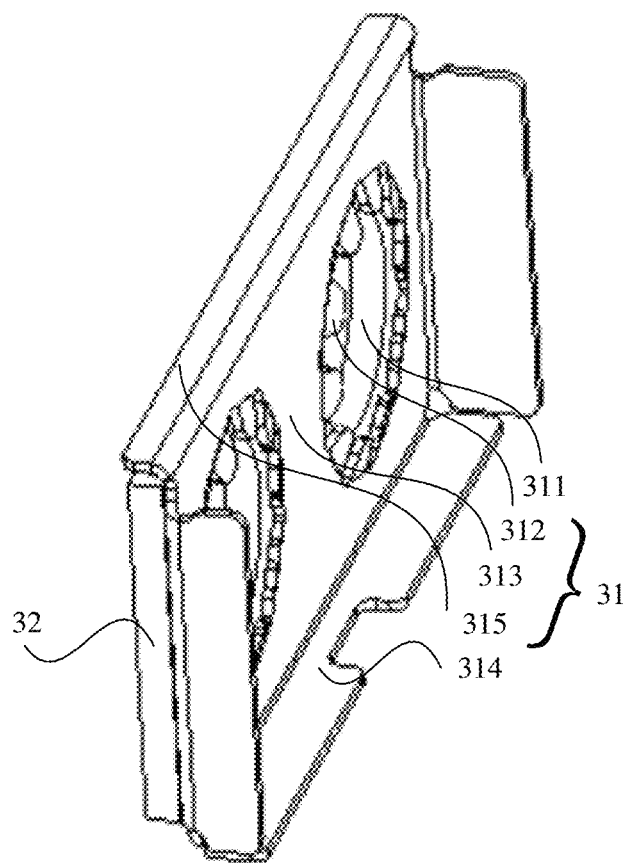
FIG. 7 is a schematic diagram of a structure of an optical port shielding and fastening apparatus according to at least one embodiment of this application.

FIG. 7 is a schematic diagram of a structure of an optical port shielding and fastening apparatus according to at least one embodiment of this application. As shown in FIG. 7, in at least one embodiment, the optical port shielding and fastening apparatus 300 includes a fastener 31 and an electromagnetic wave absorbing piece 32. The fastener 31 is configured to be sleeved on the optical component 200, and has both shielding and fastening functions. The electromagnetic wave absorbing piece 32 is fastened to the fastener 31, and mainly has a function of absorbing electromagnetic waves.

It should be noted that, a working principle of the fastener 31 is that a structural component is designed and processed to be sufficiently sealed through shielding means, so that neither conductive radiation nor space radiation leaks, and an internal component is free from external interference. However, limited by factors such as a mechanical part design, processing precision, and matching between a mechanical part and a component, the mechanical part cannot reach an ideal sealing state. To further improve electromagnetic shielding performance on the basis of the fastener 31, in at least one embodiment, the electromagnetic wave absorbing piece 32 is further disposed. A working principle of the electromagnetic wave absorbing piece 32 is that, through absorption means, a wave-absorbing material such as a conductive foam is used, and the wave-absorbing material converts an electromagnetic wave into heat energy to consume an electromagnetic wave that affects a system.

Specifically, the fastener 31 is disposed on a side close to the optical component 200, and the electromagnetic wave absorbing piece 32 is fastened on a side that is of the fastener 31 and that is away from the optical component 200. A connection manner of the electromagnetic wave absorbing piece 32 and the fastener 31 is not specifically limited. The electromagnetic wave absorbing piece 32 may be attached to the fastener 31 by using the adhesive.

A first mounting hole 311 is provided on the fastener 31. There are two first mounting holes 311. Corresponding to the two optical components 200, the fastener 31 is sleeved on the optical component 200 through the first mounting hole 311. Further, a plurality of spring plates 312 are disposed on a periphery of an inner wall of the first mounting hole 311, and the spring plate 312 is configured to press against the optical component 200.

The first mounting hole 311 is disposed on the fastener 31, and the spring plate 312 is disposed in the first mounting hole 311, so that the optical component 200 can be connected and a connection tolerance can be absorbed. Because the plurality of spring plates 312 are densely arranged on an inner ring of the first mounting hole 311, and the spring plate 312 has specific elasticity, the optical component 200 and the fastener 31 can still be well lap joined when a small amount of displacement occurs. Therefore, shielding effectiveness of the fastener 31 is improved.

Specifically, the fastener 31 includes a plate-shaped body 313 and a shielding finger 314. The shielding finger 314 is connected to a bottom edge and two side edges of the plate-shaped body 313 and is disposed bent toward a side away from the electromagnetic wave absorbing piece 32. The shielding finger 314 is configured to press against the housing assembly 100.

The plate-shaped body 313 may be disposed as a rectangular plate-shaped structure, and two first mounting holes 311 are provided on the plate-shaped body 313 in a length direction, to separately install two optical components 200. A size of the plate-shaped body 313 should match the stopper cavity 111, the upper cover 14, and the optical port cover 12 on the bottom housing 11. Shielding fingers 314 are separately disposed on a left side, a right side, and a bottom surface of the plate-shaped body 313. The shielding fingers 314 have specific elasticity, and elastic deformation occurs after the shielding fingers 314 are extruded. The shielding fingers 314 are separately configured to press against the stopper cavity 111 on the bottom housing 11, to ensure reliable fastening of the fastener 31.

The fastener 31 further includes a protective plate 315. The protective plate 315 is connected to a top edge of the plate-shaped body 313 and is disposed bent toward a side close to the electromagnetic wave absorbing piece 32. A width of the protective plate 315 is less than a width of the shielding finger 314, and has high strength. The protective plate 315 is mainly disposed to separate the electromagnetic wave absorbing piece 32 from the optical port cover 12, to prevent the optical port cover 12 from damaging the electromagnetic wave absorbing piece 32.

In at least one embodiment, the electromagnetic wave absorbing piece 32 is a conductive foam. The conductive foam not only has better electromagnetic shielding performance, but also has a function of buffering and damping. After being installed in the optical module, the conductive foam presses against the stopper cavity 111 on the bottom housing 11, and can achieve a good electromagnetic shielding effect without occupying a large space.

In at least one embodiment, the fastener 31 is an integrally formed sheet metal component. Integrated molding is not only convenient for processing and manufacturing, but also facilitates convenient and fast installation.

Figure 8:
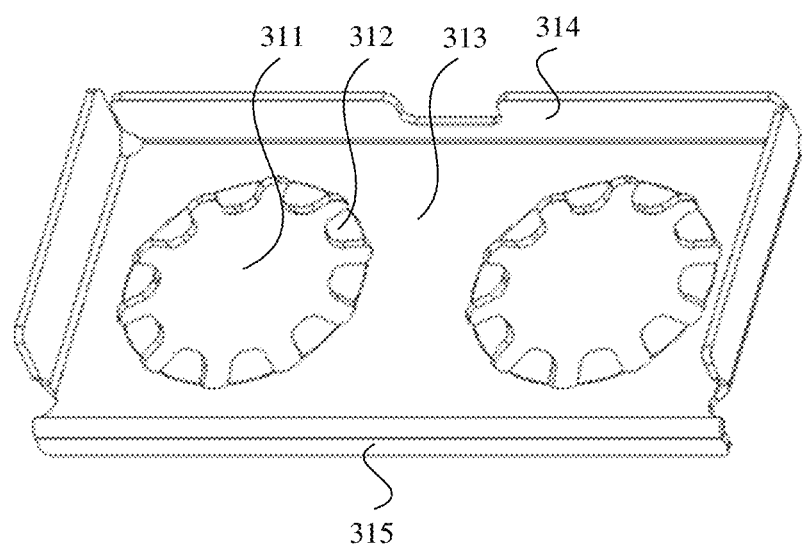
FIG. 8 is a schematic diagram of a structure of a fastener according to at least one embodiment of this application.

FIG. 8 is a schematic diagram of a structure of a fastener according to at least one embodiment of this application. As shown in FIG. 8, the fastener 31 includes the plate-shaped body 313, the protective plate 315 connected to a top edge of the plate-shaped body 313, and shielding fingers 314 connected to two sides and a bottom edge of the plate-shaped body 313. A width of the protective plate 315 is less than a width of the shielding finger 314, and the protective plate 315 and the shielding finger 314 separately extend to the two sides of the plate-shaped body 313. The two first mounting holes 311 are provided on the plate-shaped body 313 in a length direction. A plurality of spring plates 312 are densely arranged on the inner ring of the first mounting hole 311. The protective plate 315 and the shielding finger 314 each are formed by bending an edge of the plate-shaped body 313. The spring plate 312 is formed by bending an inner edge of the first mounting hole 311. Therefore, an overall structure of the fastener 31 is simple and facilitates processing and manufacturing.

Figure 9:
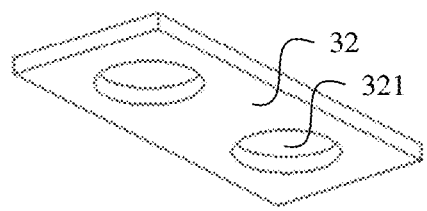
FIG. 9 is a schematic diagram of a structure of an electromagnetic wave absorbing piece according to at least one embodiment of this application.

FIG. 9 is a schematic diagram of a structure of an electromagnetic wave absorbing piece according to at least one embodiment of this application. As shown in FIG. 9, the electromagnetic wave absorbing piece 32 is rectangular as a whole. A size of the electromagnetic wave absorbing piece 32 matches a size of the plate-shaped body 313. A second mounting hole 321 is provided on the electromagnetic wave absorbing piece 32 in a length direction. A size of the second mounting hole 321 matches a size of the first mounting hole 311.

When the optical port shielding and fastening apparatus 300 is fastened on the optical component 200, ends of the optical component 200 passes through the first mounting hole 311 and the second mounting hole 321 in sequence. The size of the second mounting hole 321 may be slightly less than an outer diameter of the end part of the optical component 200, so that the optical component 200 is connected to the electromagnetic wave absorbing piece 32 through interference fit at the second mounting hole 321. In this way, at the second mounting hole 321, sealing performance is high, and radiation is further prevented from leaking from a position of the second mounting hole 321.

Figure 10:
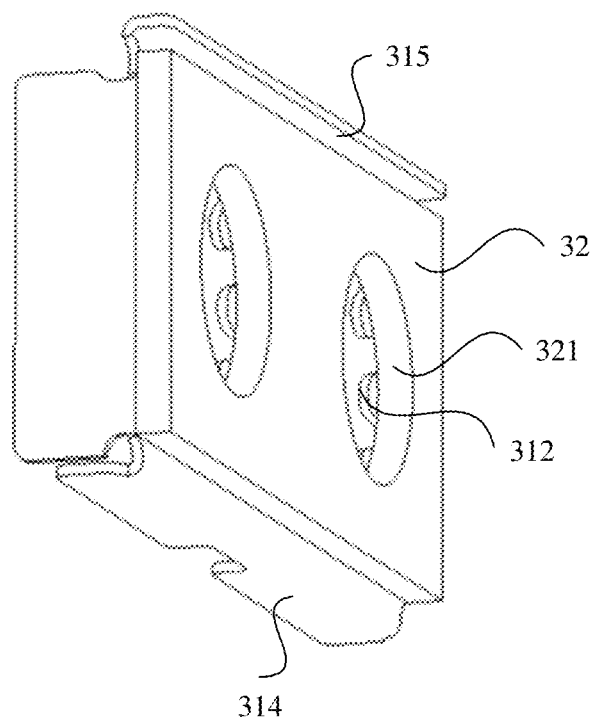
FIG. 10 is a schematic diagram of a structure of another angle of an optical port shielding and fastening apparatus according to at least one embodiment of this application.

FIG. 10 is a schematic diagram of a structure of another angle of an optical port shielding and fastening apparatus according to at least one embodiment of this application. As shown in FIG. 10, an inner diameter of the second mounting hole 321 is less than an inner diameter of the first mounting hole 321, and is greater than a diameter of a ring formed at an inner edge of the spring plate 312. In this case, the optical port shielding and fastening apparatus 300 is observed from an angle of the electromagnetic wave absorbing piece 32, and a part of a structure of the spring plate 312 may be exposed inside the second mounting hole 321.

In this way, the electromagnetic wave absorbing piece 32 can block an assembly gap between the first mounting hole 311 and the optical component 200 to some extent. In addition, because the optical component 200 may be connected to the electromagnetic wave absorbing piece 32 through interference fit at the second mounting hole 321, radiation leakage from positions of the second mounting hole 321 and the first mounting hole 311 can be further prevented.

Figure 11:
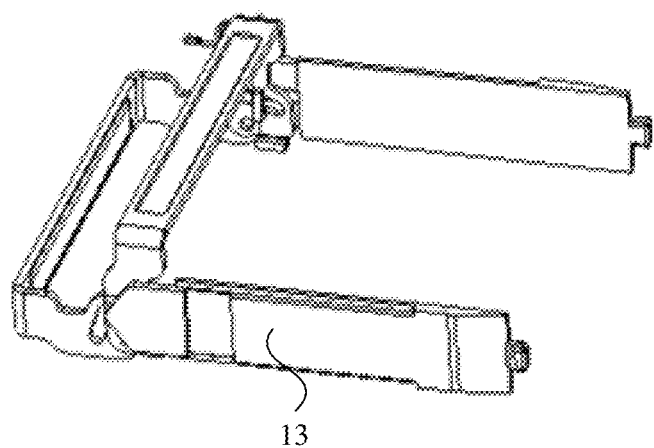
FIG. 11 is a schematic diagram of a structure of an unlocking assembly according to at least one embodiment of this application.

FIG. 11 is a schematic diagram of a structure of an unlocking assembly according to at least one embodiment of this application. As shown in FIG. 11, the unlocking assembly 13 is a drawer-type pluggable structure. Two oppositely disposed side panels of the unlocking assembly 13 are separately configured to be inserted into two side panels of the bottom housing 11, and are clamped and fastened to the bottom housing 11 through buckle structures at end parts of the two side panels. In addition, the unlocking assembly 13 is connected to an end beam between the two side panels, and may fit the upper cover 14. After the unlocking assembly 13 is removed, the front end of the housing assembly 100 is no longer sealed, and a structure such as the optical component 200 is exposed. The unlocking assembly 13 is configured to implement self-locking and unlocking functions of the optical module. The unlocking assembly 13 has a simple structure and is easy to implement.

Figure 12:
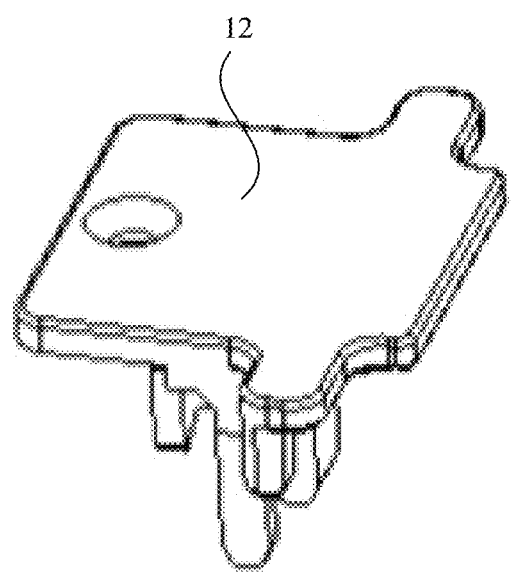
FIG. 12 is a schematic diagram of a structure of an optical port cover according to at least one embodiment of this application.

FIG. 12 is a schematic diagram of a structure of an optical port cover according to at least one embodiment of this application. As shown in FIG. 12, the optical port cover 12 is disposed above the optical component 200 and the optical port shielding and fastening apparatus 300. An upper surface of the optical port cover 12 is flat, so that covering of the upper cover 14 is not affected. A plurality of mechanical parts are protuberantly disposed at a lower part of the optical port cover 12, to press against the optical component 200 and the optical port shielding and fastening apparatus 300, and fit the bottom housing 11.

An assembly procedure of the optical module provided in at least one embodiment of this application is as follows: First, the unlocking assembly 13 is assembled on the bottom housing 11, the optical component 200 and another auxiliary material are assembled at a corresponding position on the circuit board 400, and then the optical port shielding and fastening apparatus 300 is connected to the front end of the optical component 200. Then, the circuit board 400 connected to the optical component, the optical port shielding and fastening apparatus 300, and the like is integrally fastened on the bottom housing 11, the optical port cover 12 is installed above the optical port, and finally the upper cover 14 is disposed above the bottom housing 11, and the threaded fastener is tightened.

On the whole, the optical module provided in at least one embodiment has the following components: the optical port shielding and fastening apparatus 300, where the optical port shielding and fastening apparatus 300 includes the sheet metal fastener 31 and the electromagnetic wave absorbing piece 32, to achieve functions of wave absorbing, noise reduction, and shielding inside the optical module, and gain of optical port shielding effectiveness is about 5 db; the optical port cover 12, configured to cooperate with the bottom housing 11, to fasten the optical component 200; the optical component 200 and the circuit board 400, where the optical component 200 is coupled to the circuit board 400, to implement an optical-to-electrical conversion function; the unlocking assembly 13, which cooperates with the bottom housing 11 and the upper cover 14, and is configured to implement self-locking and unlocking functions of the optical module by plugging and unplugging a cage; and the bottom housing 11 and the upper cover 14, configured to accommodate the optical component 200, the circuit board 400, and another auxiliary material, and to be plugged and unplugged with the cage, to implement the functions of the optical module.

According to the optical module provided in at least one embodiment of this application, the optical port shielding and fastening apparatus having the fastener and the electromagnetic wave absorbing piece is additionally disposed. The fastener and the electromagnetic wave absorbing piece separately shield and absorb electromagnetic radiation, so that electromagnetic radiation energy at the optical port can be effectively reduced, and electromagnetic energy radiated from inside the optical module and electromagnetic energy radiated from external electromagnetic energy to inside the optical module can be reduced. In this way, an EMC feature of the optical module is optimized and electromagnetic interference is reduced. In addition, the optical port shielding and fastening apparatus can meet both positioning and vibration reduction requirements. This effectively simplifies module parts and improves module assembly efficiency.

Still another aspect of this application provides a communications device, including the optical module provided in the foregoing embodiment.

The communications device includes a switch, a router, a data center device, and the like. The optical module cooperates with a corresponding communications device to perform optical fiber communication. Generally, the communications device has a cage specially reserved for the optical module. After the optical module is inserted into the cage, the optical module is electrically connected to the communications device through an edge connector of a circuit board in the optical module. Then, the optical module is connected to one end of an optical fiber, and the other end of the optical fiber is connected to another communications device into which the optical module is inserted. In this way, the two communications devices can implement optical fiber communication through the optical fiber and the optical module.

Specifically, the optical module converts information (such as voice) to be transmitted into an electrical signal, and then modulates the electrical signal to a laser beam emitted by a laser of the optical module. In this way, intensity of light varies with a change of an amplitude or a frequency of the electrical signal, and an optical signal is transmitted through an optical fiber. When the optical module receives the optical signal, a photodiode in the optical module converts the optical signal into an electrical signal, and demodulates the electrical signal to restore original information.

With development of the optical communications industry, it is always accompanied by the discussion and evolution of issues such as optoelectronic performance indicator, reliability, electromagnetic radiation compatibility, and electrostatic protection. In addition to bringing convenience to people, an optical communications device also brings negative impact. For example, if electromagnetic radiation exceeds a threshold, it may cause discomfort to a human body in a short term, and may cause aging and deterioration of human cells in a long term, which significantly affects a lifespan of the human body. Therefore, during research and development of the optical module, the negative impact of the electromagnetic radiation needs to be reduced.

Especially, long-distance optical fiber communication requires higher power of a laser. Therefore, a voltage swing and an alternating current that drive the laser also need to be correspondingly increased, so that radiation generated by a circuit inside an optical module is also increased. As a result, more electromagnetic waves are radiated by the optical module through a gap of the optical module, and the electromagnetic waves enter a chassis of a communications device and interfere with normal operation of another chip of the communications device. Consequently, electromagnetic radiation performance of the entire communications device cannot meet a standard requirement.

To resolve the foregoing problem, the communications device provided in at least one embodiment uses the optical module with good electromagnetic shielding performance.

Specifically, the optical module includes: a housing assembly 100, an optical component located inside the housing assembly 100, and an optical port shielding and fastening apparatus 300.

The housing assembly 100 includes a bottom housing 11 and an optical port cover 12. A stopper cavity 111 is disposed on the bottom housing 11, the optical port shielding and fastening apparatus 300 is disposed in the stopper cavity 111, and an electromagnetic wave absorbing piece 32 is in interference fit with a wall surface of the stopper cavity 111. The optical port cover 12 is disposed above the optical port shielding and fastening apparatus 300 and fits the bottom housing 11.

The housing assembly 100 further includes an upper cover 14. The upper cover 14 is disposed on the bottom housing 11, to form a closed accommodation space. An electrical appliance and an electronic device in the optical module are assembled in the accommodation space. An unlocking assembly 13 is disposed at a front end of the housing assembly 100. The unlocking assembly 13 fits the bottom housing 11. Specifically, the unlocking assembly 13 may be of a pluggable cage structure, and is configured to implement self-locking and unlocking functions of the optical module.

An optical component 200 may include a transmitter optical subassembly (TOSA) and a receiver optical subassembly (ROSA). The transmitter optical subassembly is a component that converts an electrical signal into an optical signal by using a laser and transmits the optical signal. The receiver optical subassembly is a component that converts a received optical signal into an electrical signal by using a photodiode. The optical component 200 is encapsulated in a protuberantly disposed near-cylindrical metal piece. The metal is mostly made of a stainless steel material and is a good conductor. The optical component 200 is connected to a circuit board 400 through a flexible plate. When the optical module works, both the flexible plate and the circuit board 400 emit electromagnetic waves.

The optical port shielding and fastening apparatus 300 includes a fastener 31 and an electromagnetic wave absorbing piece 32. The fastener 31 is fastened in the housing assembly 100. The electromagnetic wave absorbing piece 32 is fastened on a side that is of the fastener 31 and that faces an outside of the housing assembly 100. A first mounting hole 311 and a second mounting hole 321 are correspondingly provided on the fastener 31 and the electromagnetic wave absorbing piece 32. The optical component 200 passes through the first mounting hole 311 and the second mounting hole 321 in sequence.

A plurality of spring plates 312 are disposed on a periphery of an inner wall of the first mounting hole 311, and the spring plate 312 is configured to press against the optical component 200. The fastener 31 includes a plate-shaped body 313 and a shielding finger 314. The shielding finger 314 is connected to a bottom edge and two side edges of the plate-shaped body 313 and is disposed bent toward a side away from the electromagnetic wave absorbing piece 32. The shielding finger 314 is configured to press against the housing assembly 100. The fastener 31 further includes a protective plate 315. The protective plate 315 is connected to a top edge of the plate-shaped body 313 and is disposed bent toward a side close to the electromagnetic wave absorbing piece 32.

The electromagnetic wave absorbing piece 32 is attached to the fastener 31 by using adhesive. The electromagnetic wave absorbing piece 32 is a conductive foam. The fastener 31 is an integrally formed sheet metal component.

The communications device provided in at least one embodiment of this application has the optical module. An optical port shielding and fastening apparatus having a fastener and an electromagnetic wave absorbing piece is disposed in the optical module. The fastener and the electromagnetic wave absorbing piece separately shield and absorb electromagnetic radiation, so that electromagnetic radiation energy at an optical port can be effectively reduced, and electromagnetic energy radiated from inside the optical module and electromagnetic energy radiated from external electromagnetic energy to inside the optical module can be reduced. In this way, an EMC feature of the optical module is optimized and overall electromagnetic interference of the communications device is reduced. In addition, the optical port shielding and fastening apparatus can meet both positioning and vibration reduction requirements. This effectively simplifies module parts and improves optical module assembly efficiency, and further reduce costs of the entire communications device.

In descriptions of embodiments of this application, it should be noted that, unless otherwise clearly specified and limited, terms "assemble", "connected", and "connection" should be understood in a broad sense. For example, the terms may be used for a fastened connection, an indirect connection through an intermediate medium, an internal connection between two elements, or an interaction relationship between two elements. For persons of ordinary skill in the art, specific meanings of the foregoing terms in embodiments of this application may be understood according to a specific situation.

In the specification, claims, and accompanying drawings of embodiments of this application, the terms "first", "second", "third", "fourth", and the like (if existent) are intended to distinguish between similar objects but do not necessarily indicate a specific order or sequence.

Moreover, the terms "include", "contain" and any other variants mean to cover non-exclusive inclusions. For example, a process, method, system, product, or device that includes a list of steps or units is not necessarily limited to those expressly listed steps or units, but may include other steps or units that are not expressly listed or inherent to the process, method, product, or device.

Finally, it should be noted that the foregoing embodiments are merely intended for describing the technical solutions in embodiments of this application rather than limiting this application. Although embodiments of this application are described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of embodiments of this application.

The invention claimed is:

1. An optical port shielding and fastening apparatus, configured to be installed in an optical module, wherein the optical module comprises a housing assembly and an optical component located in the housing assembly, the optical port shielding and fastening apparatus comprising:
    a fastener; and
    an electromagnetic wave absorbing piece, wherein
    the fastener is configured to be fastened in the housing assembly,
    the electromagnetic wave absorbing piece is fastened on a first side of the fastener, the first side configured to face an outside of the housing assembly,
    a first mounting hole and a second mounting hole are correspondingly provided on the fastener and the electromagnetic wave absorbing piece, and configured for the optical component to pass through the first mounting hole and the second mounting hole in sequence, and the fastener is an integrally formed sheet metal component and the fastener comprises:
- a plate-shaped body having the first mounting hole,
- a plurality of spring plates disposed on a periphery of an inner wall of the first mounting hole,
- a shielding finger connected to a first edge of the plate-shaped body and bent away from the electromagnetic wave absorbing piece, and
- a protective plate connected to a second edge of the plate-shaped body and bent toward the electromagnetic wave absorbing piece, the second edge different from the first edge.

2. The optical port shielding and fastening apparatus according to claim 1, wherein
the plurality of spring plates is configured to press against the optical component.

3. The optical port shielding and fastening apparatus according to claim 2, wherein
the shielding finger is configured to press against the housing assembly.

4. The optical port shielding and fastening apparatus according to claim 3, wherein
the first edge comprises a bottom edge and two side edges of the plate-shaped body, and
the second edge comprises a top edge of the plate-shaped body.

5. The optical port shielding and fastening apparatus according to claim 2, wherein a diameter of the second mounting hole is less than a diameter of the first mounting hole.

6. The optical port shielding and fastening apparatus according to claim 5, wherein the diameter of the second mounting hole is greater than a diameter of a ring formed at inner edges of the plurality of spring plates.

7. The optical port shielding and fastening apparatus according to claim 5, wherein the plurality of spring plates is partially exposed inside the second mounting hole.

8. The optical port shielding and fastening apparatus according to claim 1, wherein the electromagnetic wave absorbing piece is attached to the fastener by adhesive.

9. The optical port shielding and fastening apparatus according to claim 1, wherein the electromagnetic wave absorbing piece is a conductive foam.

10. The optical port shielding and fastening apparatus according to claim 1, wherein the electromagnetic wave absorbing piece is of a material configured to convert an electromagnetic wave into heat energy.

11. The optical port shielding and fastening apparatus according to claim 1, wherein a width of the protective plate is less than a width of the shielding finger.

12. The optical port shielding and fastening apparatus according to claim 1, wherein
the first edge comprises a bottom edge and two side edges of the plate-shaped body, and
the second edge comprises a top edge of the plate-shaped body.

13. An optical module, comprising:
a housing assembly;
an optical component located inside the housing assembly; and
an optical port shielding and fastening apparatus comprising a fastener and an electromagnetic wave absorbing piece, wherein
the fastener is fastened in the housing assembly,
the electromagnetic wave absorbing piece is fastened on a first side of the fastener, the first side facing an outside of the housing assembly,
a first mounting hole and a second mounting hole are correspondingly provided on the fastener and the electromagnetic wave absorbing piece,
the optical component passes through the first mounting hole and the second mounting hole in sequence,
the fastener comprises:
- a plate-shaped body having the first mounting hole, and
- a plurality of spring plates disposed on a periphery of an inner wall of the first mounting hole, and pressed against the optical component, a diameter of the second mounting hole is less than a diameter of the first mounting hole, and
the diameter of the second mounting hole is greater than a diameter of a ring formed at inner edges of the plurality of spring plates.

14. The optical module according to claim 13, wherein
the housing assembly comprises a bottom housing and an optical port cover,
a stopper cavity is disposed on the bottom housing,
the optical port shielding and fastening apparatus is disposed in the stopper cavity,
the electromagnetic wave absorbing piece is in interference fit with a wall surface of the stopper cavity, and
the optical port cover is disposed above the optical port shielding and fastening apparatus and fits the bottom housing.

15. The optical module according to claim 13, wherein
the diameter of the second mounting hole is less than an outer diameter of the optical component, and the optical component is interference fit in the second mounting hole.

16. The optical module according to claim 15, wherein
the fastener further comprises:
- a shielding finger connected to a first edge of the plate-shaped body and bent away from the electromagnetic wave absorbing piece, and
- a protective plate connected to a second edge of the plate-shaped body and bent toward the electromagnetic wave absorbing piece, the second edge different from the first edge, the shielding finger is pressed against the housing assembly, and
the protective plate separates the electromagnetic wave absorbing piece from the housing assembly.

17. The optical module according to claim 16, wherein
a width of the protective plate is less than a width of the shielding finger.

18. The optical module according to claim 16, wherein
the fastener is an integrally formed sheet metal component which comprises the plate-shaped body, the plurality of spring plates, the protective plate, and the shielding finger.

19. The optical module according to claim 18, wherein
the first edge comprises a bottom edge and two side edges of the plate-shaped body, and
the second edge comprises a top edge of the plate-shaped body.

20. A communications device, comprising an optical module, the optical module comprising:
a housing assembly;
an optical component located inside the housing assembly; and
an optical port shielding and fastening apparatus comprising a fastener and an electromagnetic wave absorbing piece, wherein
the fastener is fastened in the housing assembly, the electromagnetic wave absorbing piece is fastened on a first side of the fastener, the first side facing an outside of the housing assembly, a first mounting hole and a second mounting hole are correspondingly provided on the fastener and the electromagnetic wave absorbing piece, the optical component passes through the first mounting hole and the second mounting hole in sequence, the fastener comprises:
- a plate-shaped body having the first mounting hole,
- a plurality of spring plates disposed on a periphery of an inner wall of the first mounting hole, and configured to press against the optical component,
- a shielding finger connected to a bottom edge and two side edges of the plate-shaped body, bent away from the electromagnetic wave absorbing piece, and configured to press against the housing assembly, and
- a protective plate connected to a top edge of the plate-shaped body, and bent toward the electromagnetic wave absorbing piece, and a width of the protective plate is less than a width of the shielding finger.

\* \* \* \* \*